US008809872B2

(12) United States Patent
Cai et al.

(10) Patent No.: US 8,809,872 B2
(45) Date of Patent: Aug. 19, 2014

(54) BULK FINFET WITH SUPER STEEP RETROGRADE WELL

(71) Applicant: International Business Machines Corporation, Armonk, NY (US)

(72) Inventors: Jin Cai, Cortlandt Manor, NY (US); Kevin K. Chan, Staten Island, NY (US); Robert H. Dannard, Croton-on-Hudson, NY (US); Bruce B. Doris, Brewster, NY (US); Barry P. Linder, Hastings-on-Hudson, NY (US); Ramachandran Muralidhar, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/968,570

(22) Filed: Aug. 16, 2013

(65) Prior Publication Data
US 2014/0159163 A1    Jun. 12, 2014

Related U.S. Application Data

(63) Continuation of application No. 13/708,531, filed on Dec. 7, 2012.

(51) Int. Cl.
*H01L 29/161* (2006.01)
*H01L 29/36* (2006.01)
*H01L 29/78* (2006.01)

(52) U.S. Cl.
USPC ...... 257/77; 257/289; 257/401; 257/E29.105; 257/E29.11

(58) Field of Classification Search
None
See application file for complete search history.

(56) References Cited

U.S. PATENT DOCUMENTS

| 7,235,468 | B1 | 6/2007 | Mouli |
| 8,227,316 | B2 | 7/2012 | Zhu et al. |
| 8,236,661 | B2 | 8/2012 | Dennard et al. |
| 2009/0108350 | A1 | 4/2009 | Cai et al. |
| 2011/0309447 | A1* | 12/2011 | Arghavani et al. ............ 257/368 |
| 2012/0038006 | A1 | 2/2012 | Zhu et al. |
| 2012/0126332 | A1 | 5/2012 | Zhu |
| 2012/0138953 | A1* | 6/2012 | Cai et al. ........................ 257/77 |
| 2012/0164802 | A1* | 6/2012 | Babcock et al. ............... 438/163 |

OTHER PUBLICATIONS

Liu, T.J. King, "Bulk CMOS Scaling to the End of the Roadmap", Symposium on VLSI Circuits Short Course, Jun. 13, 2012.*
Bhu, H. "FinFET Technology—A Substrate Perspective" 2011 IEEE International SOI Conference (SOI). Oct. 2011. (27 pages).
Chin, H., et al. "III-V Multiple-Gate Field-Effect Transistors With High-Mobility IN0.7GA0.3AS Channel and EPI-Controlled Retrograde-Doped FIN" IEEE Electron Device Letters, vol. 32, Issue 2. Feb. 2011. pp. 146-148.

(Continued)

*Primary Examiner* — Thomas L Dickey
*Assistant Examiner* — Joseph Schoenholtz
(74) *Attorney, Agent, or Firm* — Tutunjian & Bitetto, P.C.; Vazken Alexanian

(57) ABSTRACT

A method for forming a fin transistor in a bulk substrate includes forming a super steep retrograde well (SSRW) on a bulk substrate. The well includes a doped portion of a first conductivity type dopant formed below an undoped layer. A fin material is grown over the undoped layer. A fin structure is formed from the fin material, and the fin material is undoped or doped. Source and drain regions are provided adjacent to the fin structure to form a fin field effect transistor.

8 Claims, 5 Drawing Sheets

(56) References Cited

OTHER PUBLICATIONS

Thompson, S., et al. "Linear Versus Saturated Drive Current: Tradeoffs in Super Steep Retrograde Well Engineering" 1996 Symposium on VLSI Technology. Jun. 1996. pp. 154-155.

Shahidi, G., et al., "Indium Channel Implants for Improved MOSFET Behavior at the 100-NM Channel Length Regime" IEEE Transactions on Electron Devices, vol. 36, Issue 11. Nov. 1989. p. 2605.

* cited by examiner

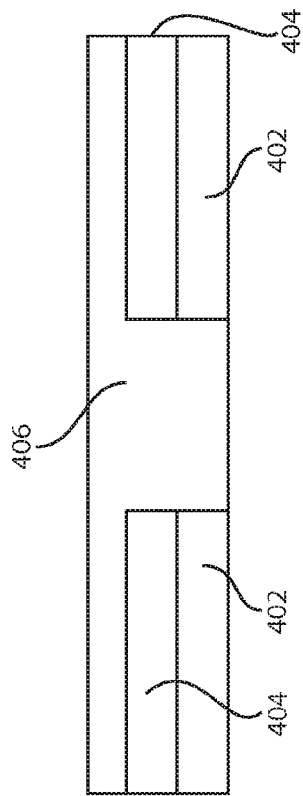
FIG. 4
FIG. 5
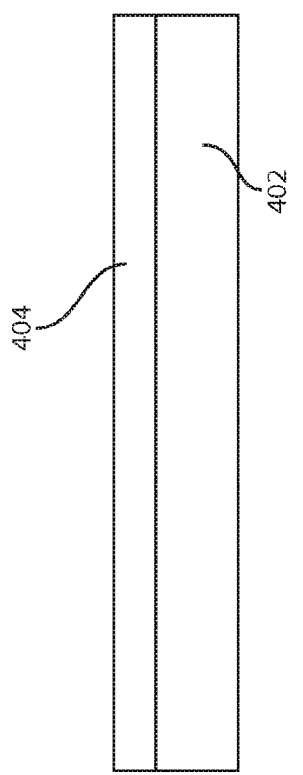
FIG. 6
FIG. 7
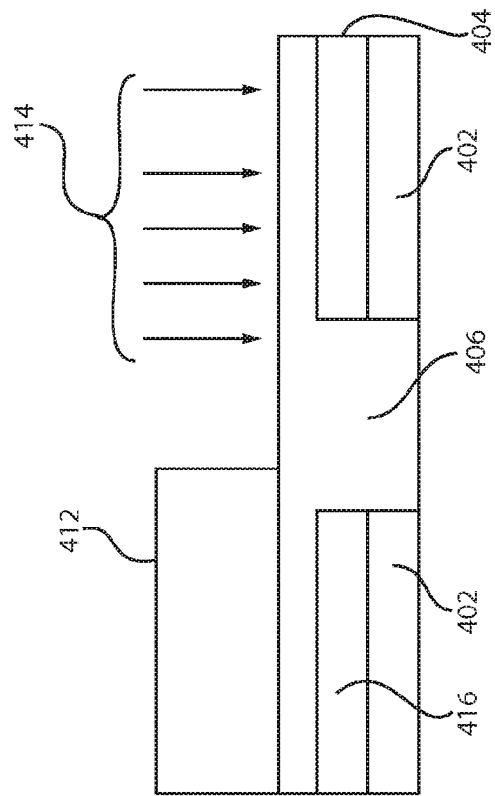
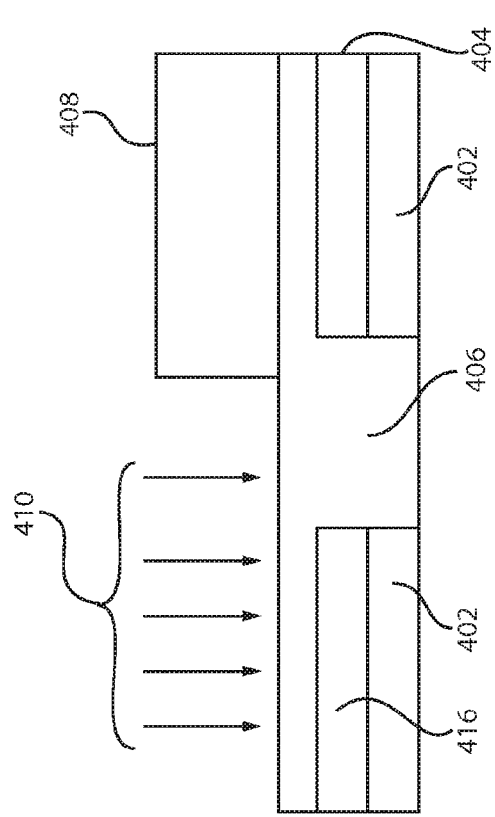

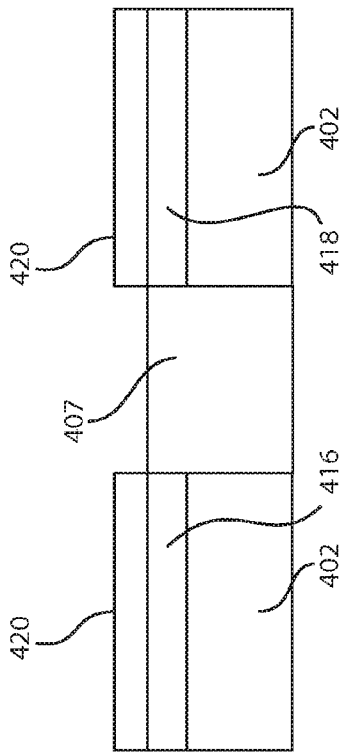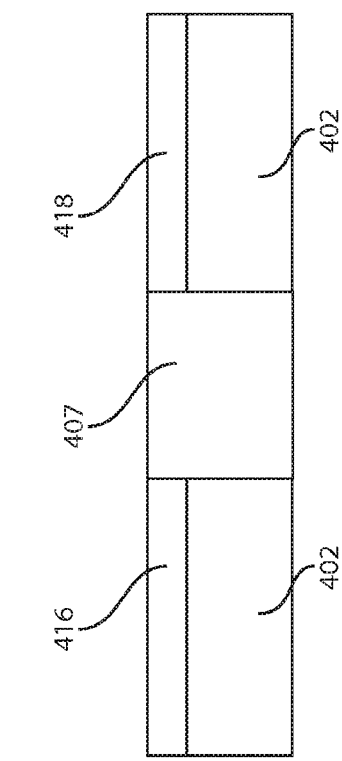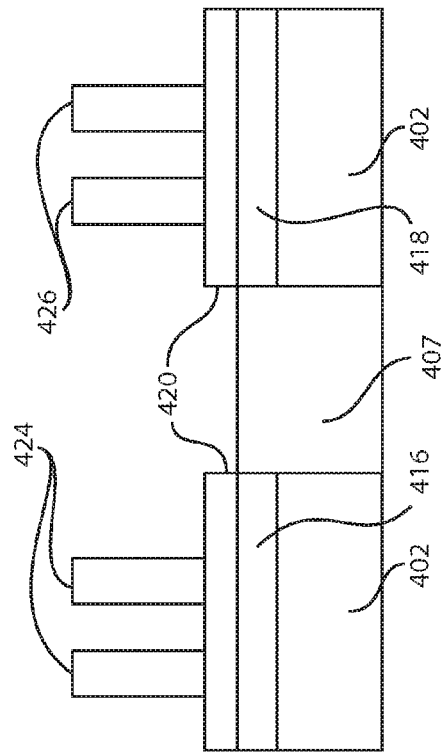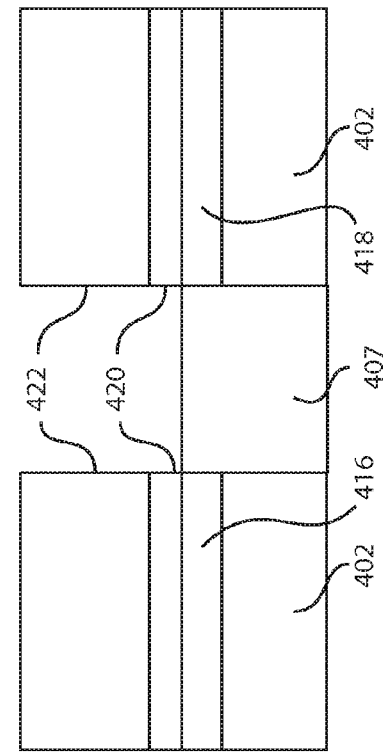

US 8,809,872 B2

BULK FINFET WITH SUPER STEEP RETROGRADE WELL

RELATED APPLICATION DATA

This application is a Continuation application of co-pending U.S. patent application Ser. No. 13/708,531 filed on Dec. 7, 2012, incorporated herein by reference in its entirety.

BACKGROUND

1. Technical Field

The present invention relates to semiconductor fabrication, and more particularly to devices and methods with a retrograde doping well to reduce or eliminate punchthrough effects in finFETs formed in bulk substrates.

2. Description of the Related Art

Punchthrough effects are parasitic leakage currents that occur in metal oxide semiconductor field effect transistors (MOSFETs) between source and drain regions. Leakage current of a metal oxide semiconductor (MOS) transistor may increase due to a parasitic current path that exists between drain and source regions. Such a parasitic path exists in bulk MOSFETs, for example, in a region that is between the source and drain but deeper below a gate. This component of the drain current is poorly controlled by the gate since the current path is located in the bulk farther away from the gate. This parasitic current adds to sub-threshold leakage current resulting in increased power consumption.

A fin field effect transistor (finFET) constructed on a silicon-on-insulator (SOI) substrate has an advantage that punchthrough effects are substantially reduced due to the presence of a buried oxide that minimizes drain-to-source coupling at the fin bottom. In bulk substrates, however, the punchthrough effect is significant in the region below the fin. One way to reduce the punchthrough effect is to increase the overall bulk substrate doping level. As a result the drain and source depletion regions will become smaller and will not establish a parasitic current path. This substrate doping however can diffuse up the fin during subsequent processing resulting in a higher threshold voltage at the bottom of the fin compared to the top. To offset this, the fin may have to be tapered (wider at bottom compared to the top) to maintain approximately uniform threshold throughout the fin height. Further, random dopant diffusion up the fin can result in threshold voltage (Vt) variations. A better alternative is needed to prevent punchthrough, maintain uniform threshold throughout fin height and mitigate Vt fluctuations.

SUMMARY

A method for forming a fin transistor with a bulk substrate includes forming a super steep retrograde well (SSRW) in or on a bulk substrate, the well including a doped portion of a first conductivity type dopant and being formed in the bulk substrate below an undoped layer, the SSRW being formed beneath a location corresponding to a fin structure; growing a fin material over the undoped layer; forming the fin structure from the fin material; forming a gate structure over the fin structure; and forming source and drain regions adjacent to the fin structure to form a fin field effect transistor.

Another method for forming fin transistors with a bulk substrate includes growing an extension region on a bulk substrate; forming a shallow trench isolation region in the bulk substrate to separate device regions; masking a first device region to form first super steep retrograde wells (SSRWs) in the extension region, the first SSRWs including a doped portion below an undoped portion of the extension region; unmasking the first device region and masking a second device region to form second SSRWs, the second SSRWs including a doped portion below an undoped portion of the extension region wherein doping in the second SSRWs has an opposite polarity of the first SSRWs; unmasking the second device region; growing a fin material over the first and second SSRWs; forming fin structures from the fin material, the fin material being doped in respective device regions with a conductivity type dopant opposite that of the SSRWs under a respective fin structure; forming gate stacks over the fin structures; and forming source and drain regions adjacent to the fin structures to form N-type and P-type fin field effect transistors.

A device having fin transistors formed with a bulk substrate includes a super steep retrograde well (SSRW) formed on or in a bulk substrate, the well including a doped portion of a first conductivity type dopant below an undoped layer, the doped portion including a highly doped ground plane. A fin structure is formed over the SSRW from fin material, a gate stack is formed over the fin structure, and source and drain regions are formed adjacent to the fin structure to form a fin field effect transistor.

Another device having fin transistors formed with a bulk substrate includes a bulk substrate, an extension region formed on the bulk substrate and a shallow trench isolation region formed in the bulk substrate to separate device regions. A first device region includes first super steep retrograde wells (SSRWs) in the extension region, the first SSRWs including a doped portion below an undoped portion of the extension region. A second device region includes second SSRWs, the second SSRWs including a doped portion below an undoped layer of the extension region where doping in the second SSRWs is of opposite polarity of the first SSRWs. Fin structures are formed in a fin material, the fin material being doped in respective device regions with a conductivity type dopant opposite that of the SSRWs under a respective fin structure. Gates stacks are formed over the fin structures. Source and drain regions are formed adjacent to the fin structures to form N-type and P-type fin field effect transistors.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 4 is a cross-sectional view of a substrate having an extension region formed thereon in accordance with the present principles;

FIG. 5 is a cross-sectional view of the substrate of FIG. 4 having a shallow trench isolation material formed to separate device regions in accordance with the present principles;

FIG. 6 is a cross-sectional view of the substrate of FIG. 5 showing masking of a first device region to dope a well in another device region in accordance with the present principles;

FIG. 7 is a cross-sectional view of the substrate of FIG. 6 showing masking of the other device region to dope a well in the first device region in accordance with the present principles;

FIG. 8 is a cross-sectional view of the substrate of FIG. 7 showing shallow trench material removed from a top surface and an activating anneal to activate dopants in the wells in accordance with the present principles;

FIG. 9 is a cross-sectional view of the substrate of FIG. 8 showing an optional etch stop layer formed in accordance with the present principles;

FIG. 10 is a cross-sectional view of the substrate of FIG. 9 showing a fin material grown in accordance with the present principles;

FIG. 11 is a cross-sectional view of the substrate of FIG. 10 showing fins etched in the fin material in accordance with the present principles.

DETAILED DESCRIPTION OF PREFERRED EMBODIMENTS

Figure 1:
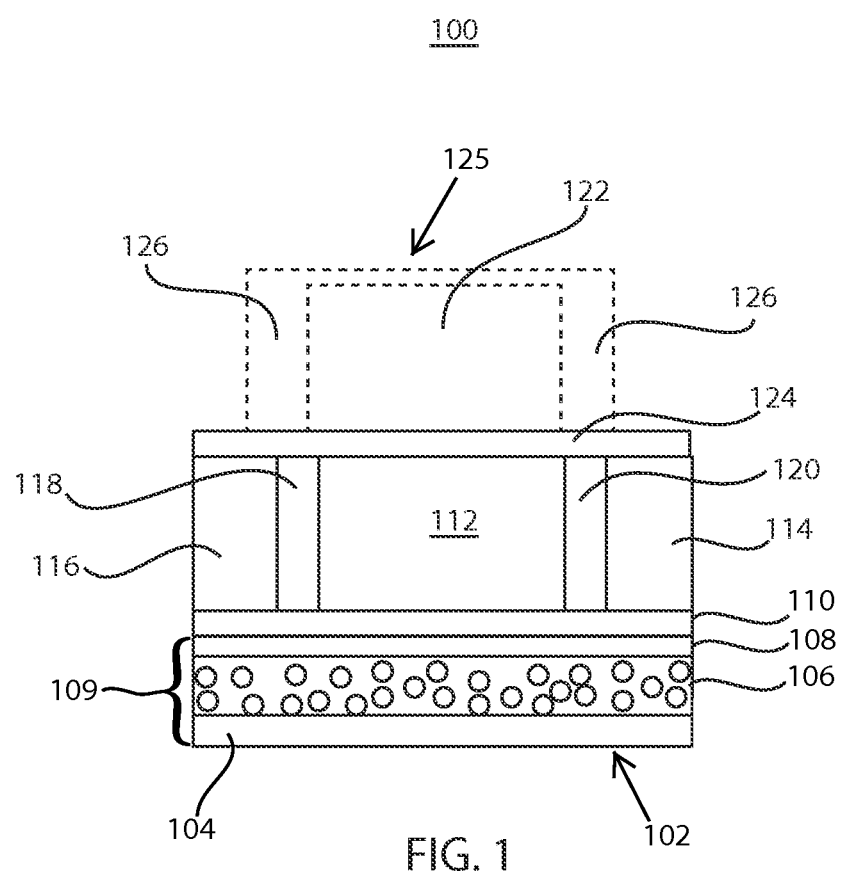
FIG. 1 is a partial cross-sectional view of a finFET device having a super steep retrograde well (SSRW) with two diffusion barriers in accordance with the present principles.

In accordance with the present principles, devices and methods for reducing or eliminating punchthrough effects, threshold voltage fluctuations and issues in bulk substrate fin field effect transistor (finFETs) are provided. In particularly useful embodiments, a super steep retrograde well (SSRW) is formed below the fin in the substrate. SSRW may be employed in the context of planar bulk devices to improve drain induced barrier lowering (DIBL) over halo designs and to mitigate the impact of random dopant fluctuations.

In finFETs, DIBL is primarily affected by fin thickness and gate dielectric thickness except near the bottom of the fin (closest to a substrate). Thus, SSRW is particularly effective at preventing punchthrough at the bottom of the fin. The SSRW also mitigates dopant diffusion into the fin that results in varying threshold voltage (Vt) along a fin height, which leads to less effective use of the entire fin height. Further, the SSRW structure prevents random dopant fluctuations that arise from dopant diffusion into the fin.

It is to be understood that the present invention will be described in terms of a given illustrative architecture having a substrate, which may include use of a semiconductor wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments in accordance with the present principles may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw form (that is, as a single flexible substrate that has multiple structures formed thereon), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a semiconductor device structure 100 is illustratively shown in accordance with one embodiment. Structure 100 includes a finFET although other structures may be employed, and in particular, structures formed on a bulk planar substrate. The structure 100 includes a substrate 102, which may be diced from a semiconductor wafer or may be formed as an individual or group of devices on the wafer. The substrate 102 preferably includes a monocrystalline material, such as silicon; however, other semiconductor material may be employed including but not limited to SiGe, SiC, GaAs, InP, InGaAs, etc.

In a particularly useful embodiment, monocrystalline Si is employed for substrate 102. A super steep retrograde well (SSRW) 109 is formed in or on the substrate 102. In one embodiment, the SSRW 109 is formed using an epitaxial growth process to extend the substrate 102 and maintain the monocrystalline structure of the substrate 102. In another embodiment, the substrate 102 may be doped with, e.g., C or other dopants, to form the SSRW region 109.

SSRW 109 may include graded doping regions. These doping regions may include a diffusion barrier region 104, a diffusion barrier region 108 and a ground plane region 106. The SSRW 109 may be formed of a same base material and be doped differently throughout its depth to form the different regions. In one embodiment, the SSRW 109 may include a SiC base material, which is particularly useful in reducing dopant diffusion. The ground plane 106 may include a highly doped region while the diffusion barriers 104 and 108 may include undoped or low doped SiC or may include other materials including different dopant levels or types.

Through this disclosure, highly doped means having a dopant concentration of $10^{18}$ carriers/cm$^3$ to $10^{20}$ carriers/cm$^3$ or greater. An undoped (very low doped) layer 110 may be formed on the substrate 102 as part of the substrate extension. An undoped layer as described herein will include a no dopant region or very low doped region having a dopant concentration of $10^{17}$ carriers/cm$^3$ or less. The layer 110 may form or include an etch stop layer and is preferably epitaxially grown to provide a crystalline/monocrystalline structure. The layer 110 may include, e.g., SiGe or other suitable materials. The layer 110 may be formed as part of the substrate extension or may include a different material than the layers of the SSRW 109.

Doping of SSRW 109 is provided in the substrate 102 or on the substrate 102 below a fin 112. In one embodiment, the SSRW is formed by implanting dopants into the substrate 102 or into the extended substrate (109) formed by epitaxially growth (e.g., SiC) with in-situ or implantation doping. The ground plane 106 is highly doped and is constructed a few nm (e.g., 2 nm-20 nm) below a lower surface of the fin 112 to terminate field lines emanating from a drain 116. The ground plane 106 significantly reduces punchthrough. A region (e.g., layers 108 and/or 110) of the substrate 102 between the fin (112) bottom and the ground plane 106 is essentially undoped. Thus, punchthrough is prevented and dopant diffusion from the ground plane 106 to the fin 112 is reduced by the intervening undoped region of layers 108 and 110. The doping from the ground plane 106 to the fin 112 can be undoped or very low doped substrate 102 material. However, in the present embodiment, diffusion is further mitigated by providing layer 108, which may include SiC, and layer 110, which may include SiGe between the fin 112 and the ground plane 106.

Preventing dopant diffusion into the fin 112 mitigates the problem of threshold variation along the fin height as well as the impact of dopant fluctuations and discrete dopant effects that are associated with spatial distribution of dopants in the fin 112. The ground plane 106 may be doped with B or P depending on the conductivity of the finFET formed by structure 100. In planar bulk technologies, B and P are particularly useful for this application since these materials diffuse extremely slowly in SiC, and B diffuses very slowly in SiGe. Other dopants may be employed as well with other substrate materials.

The finFET of structure 100 includes the drain 116 and a source 114 isolated from the fin 112 by dielectric materials 118 and 120, respectively. The fin 112 may be undoped or doped to provide a desired threshold voltage. A gate stack 125 includes gate dielectric 124, gate conductor 122 and spacers 126 formed directly over a top of the fin 112. The gate stack 125 is illustratively shown in phantom lines since the gate stack 125 would normally be offset into or out of the plane of the page relative to the partial cross-section shown.

The fin 112, source 114 and drain 116 may include epitaxially grown silicon or other crystalline/monocrystalline materials. The source 114 and drain 116 may be formed from other materials, such as doped polysilicon, a metal, or other conductive or semiconductive media. The source 114 and drain 116 may be formed as fin structures as well.

Figure 2:
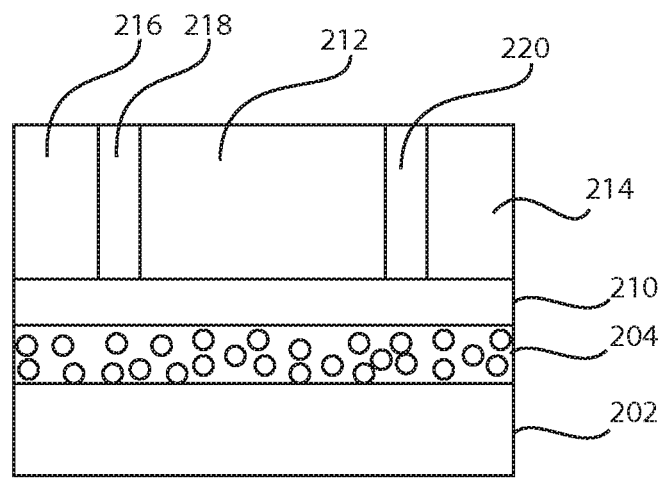
FIG. 2 is a partial cross-sectional view of a finFET device having a super steep retrograde well (SSRW) formed below a fin in an NFET in accordance with the present principles.

Referring to FIG. 2, another semiconductor device structure 200 is illustratively shown in accordance with another embodiment. Structure 200 includes an N-type finFET (NFET) formed on a bulk planar substrate 202. The substrate 202 preferably includes a monocrystalline material, such as silicon; however, other semiconductor material may be employed including but not limited to SiGe, SiC, GaAs, InP, InGaAs, etc.

In a particularly useful embodiment, monocrystalline Si is employed for substrate 202. A super steep retrograde well (SSRW) 204 is formed in or on the substrate 202. In one embodiment, the SSRW 204 is formed using an epitaxial growth process to extend the substrate 202 and maintain the monocrystalline structure of the substrate 202.

SSRW 204 forms a ground plane region. In one embodiment, the SSRW 204 may include a SiGe base material, which is particularly useful in reducing dopant diffusion. SSRW 204 is highly doped with a P-type dopant, and, in particular, B. A portion 210 (e.g., Si, SiC, etc.) of the substrate 202 is undoped or low doped or may include other materials including different dopant levels or types. Portion 210 may include SiC to provide a more effective diffusion barrier and to perform as an etch stop layer for forming a fin 212. The undoped etch stop layer may be formed over the substrate 202 in some embodiments. The etch stop layer may also include, e.g., SiGe or other suitable materials.

The SSRW 204 may be formed by epitaxially growing SiGe on the Si substrate 202 while in-situ doping B (or other P-type dopant). Portion 210 may be formed by an epitaxially growth of material for fin 212 or a different material (e.g., an etch stop layer).

In one embodiment, the SSRW 204 is constructed a few nanometers (e.g., 2 nm-20 nm) below a lower surface of the fin 212 to terminate field lines emanating from a drain 216. The ground plane 204 significantly reduces punchthrough. The portion 210 is essentially undoped. Thus, punchthrough is prevented and dopant diffusion from the ground SSRW 204 to the fin 212 is reduced by the intervening undoped regions of portion 210. The dopant diffusion to the fin 212 is further mitigated by providing a layer, e.g., a SiGe material for SSRW 204 with B dopants, which remain trapped in the layer 204 keeping portion 210 undoped by the B dopants.

Preventing dopant diffusion into the fin 212 mitigates the problem of threshold variation along the fin height as well as the impact of dopant fluctuations and discrete dopant effects that are associated with spatial distribution of dopants in the fin 212.

The finFET of structure 200 includes the drain 216 and the source 214 isolated from the fin 212 by dielectric materials 218 and 220, respectively. The fin 212 is undoped or doped to attain the desired threshold voltage. A conductive channel forms at an upper surface of the fin 212 below a gate stack (not shown), which would be directly above the fin 212.

Figure 3:
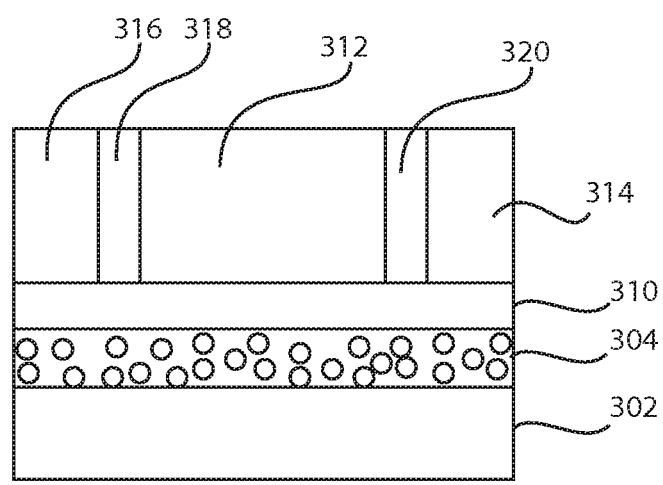
FIG. 3 is a partial cross-sectional view of a finFET device having a super steep retrograde well (SSRW) formed below a fin in a PFET in accordance with the present principles.

Referring to FIG. 3, another semiconductor device structure 300 is illustratively shown in accordance with another embodiment. Structure 300 includes a P-type finFET (PFET) formed on a bulk planar substrate 302. The substrate 302 preferably includes a monocrystalline material, such as silicon; however, other semiconductor material may be employed including but not limited to SiGe, SiC, GaAs, InP, InGaAs, etc.

In a particularly useful embodiment, monocrystalline Si is employed for substrate 302. A super steep retrograde well (SSRW) 304 is formed in or on the substrate 302. In one embodiment, the SSRW 304 is formed using an epitaxial growth process to extend the substrate 302 and maintain the monocrystalline structure of the substrate 302.

SSRW 304 forms a ground plane region. In one embodiment, the SSRW 304 may include a SiC base material, which is particularly useful in reducing dopant diffusion. SSRW 304 is highly doped with an N-type dopant, and, in particular, P. A portion 310 (e.g., Si, SiGe, etc.) of the substrate 302 is undoped or low doped or may include other materials including different dopant levels or types. Portion 310 may include SiGe to provide a more effective diffusion barrier and to perform as an etch stop layer for forming a fin 312. The undoped etch stop layer (310) may be formed over the substrate 302 in some embodiments. The etch stop layer may also include, e.g., SiGe or other suitable materials.

The SSRW 304 may be formed by epitaxially growing SiC on the Si substrate 204 while in-situ doping P (or other N-type dopant). Portion 310 may be formed by an epitaxially growth of material for fin 312 or a different material (e.g., an etch stop layer). In one embodiment, the SSRW 304 is constructed a few nm (e.g., 2 nm-20 nm) below a lower surface of the fin 312 to terminate field lines emanating from a drain 316. The ground plane 304 significantly reduces punchthrough. The portion 310 is essentially undoped. Thus, punchthrough is prevented and dopant diffusion from the ground SSRW 304 to the fin 312 is reduced by the intervening undoped regions of portion 310. The dopant diffusion to the fin 312 is further mitigated by providing a layer, e.g., a SiC material for SSRW 304 with P dopants, which remain trapped in the layer (304) keeping portion 310 undoped by the P dopants.

Preventing dopant diffusion into the fin 312 mitigates the problem of threshold variation along the fin height as well as the impact of dopant fluctuations and discrete dopant effects that are associated with spatial distribution of dopants in the fin 312.

The finFET of structure 300 includes the drain 316 and a source 314 isolated from the fin 312 by dielectric materials 318 and 320, respectively. The fin 312 is undoped or doped to provide for the desired threshold voltage. A conductive channel forms at an upper surface of the fin 312 below a gate stack (not shown), which would be directly above the fin 312.

Referring to FIGS. 4-11, an illustrative method is shown for forming a device with NFETs and PFETs. It should be understood that other methods and device structures may be formed in accordance with the principles described.

Referring to FIG. 4, a substrate 402 is provided. The substrate 402 may include monocrystalline Si. An epitaxial layer 404 may be formed on the substrate 402. In one embodiment, the layer 404 includes SiC, however, other materials may be employed as well, e.g., SiGe, etc. It should be understood that additional layers may be epitaxially formed as well. For example, diffusion barriers of SiGe or SiC or additional Si may be formed on or over layer 404.

Referring to FIG. 5, shallow trench isolation (STI) regions 406 are formed by etching trenches and depositing a dielectric layer in the trenches and over the layer 404. The STI regions 406 may include an oxide or nitride, although other dielectric materials may be employed.

Referring to FIG. 6, a mask 408 is deposited and patterned over a portion of the STI regions 406 and a corresponding one of an NFET or a PFET finFET device. The mask 408 may include a hard mask or a resist mask. Dopants 410 of a first conductivity type are implanted using a low energy process to drive the dopants into the layer 404 that remains unmasked to form a well 416. The dopants 410 may include, e.g., boron dopants to form a P-well or phosphorous dopants to form an N-well. Other dopants may be employed as well. The mask 408 is then removed.

Referring to FIG. 7, a mask 412 is deposited and patterned over a portion of the STI regions 406 and a corresponding one of the other of an NFET or a PFET finFET device. The mask 412 may include a hard mask or a resist mask. Dopants 414 of a second conductivity type (opposite the first conductivity type) are implanted using a low energy process to drive the dopants into the layer 404 that remains unmasked to form a well 418 (FIG. 8). The dopants 414 may include phosphorous dopants to form an N-well or boron dopants to form a P-well. Other dopants may be employed as well. The mask 412 is then removed.

Referring to FIG. 8, the upper portion of the STI regions 406 is removed by a planarization process, e.g., a chemical mechanical polish (CMP) or the like. An STI 407 remains between wells 416 and 418. An anneal process is performed to activate the wells 416 and 418.

Referring to FIG. 9, an optional fin etch stop layer 420 may be selectively grown on wells 416 and 418. If the material of the wells 416 and 418 includes SiGe, the etch stop layer 420 may include SiC. If the material of the wells 416 and 418 includes SiC, the etch stop layer 420 may include SiGe. If the material of the wells 416 and 418 is mixed (e.g., one well SiC and the other SiGe), the etch stop layer 420 may include SiGe or SiC, respectively. Mixed materials for the wells 416, 418 may be provided using a masking procedure similar to that described above. The material selection will depend on the application of the devices, dopants selected for the ground plane formed in the wells 416, 418, etc.

Referring to FIG. 10, fin material 422 is grown on the etch stop layer 420 (or the wells 416, 418, if the etch stop layer 420 is not employed). The fin material 422 is epitaxially grown and preferably includes Si, although other semiconductor materials may be employed. The fin materials 422 may be grown separately for NFETs and PFETs by employing masking procedures as described above. Separate growth permits in-situ doping of the fin material 422 during the growth process and compensates for any differential growth rates on two different etch stop layers. In another embodiment, the fin materials 422 are grown together and doped separately. In yet another embodiment, formed fins may be doped after formation. In still another embodiment, the fin material 422 remains undoped.

Referring to FIG. 11, fins 424 and fins 426 are etched down to the etch stop layer 420 using a fin mask etching process. If etch stop layers are not used, a timed etch is employed to define the fin height. One of fins 424 and 426 are for forming NFETs, and the other of fins 424 and 426 are for forming PFETs. The wells 416 and 418 provide a location of high doping to form SSRW regions (e.g., a ground plane) separated from the fins 424 and 426. For example, the well 424 may include SiC and be doped with phosphorous for a PFET fin device, and well 426 may include SiGe doped with boron for an NFET fin device.

In other embodiments, the extension layer 404 (FIG. 4) may be in-situ doped using selective epitaxy to grow a P-well and an N-well at different times (e.g., using masking). The N-well and P-well (416 and 418) provide a doped portion of the SSRW. An undoped portion is provided over the wells 416, 418. The undoped portion may take the form of an undoped portion or layers above the wells 416, 418 or may include another layer, such as an etch stop layer 420 or a layer portion of the fin material 422.

One of the wells 416 and 418 may be employed with an NFET where the extension region 404 has a heavily doped ground plane layer made from in-situ doped B SiGe with an undoped SiC layer above the doped B SiGe. The undoped portion may be employed as an etch stop layer for forming the fins (one of 424 or 426). Similarly, a PFET may include a ground plane layer (404) with a heavily in-situ doped P SiC with an undoped SiGe layer above the doped portion.

In an alternate embodiment, the undoped portion may be Si for both NFETs and PFETs and a timed etch is employed through the fin material 422 to set a fin height when etching the fin material 422 to form fins 424 and 426. For example, instead of the etch stop layer 420, a silicon layer formed from fin material 422 has a layer remaining at a base of the fines 424 and 426. Additional processing includes the formation of gate dielectrics, gates conductors, sources, drains, contacts, metallization, dielectric layers, etc. to complete the structure.

Figure 12:
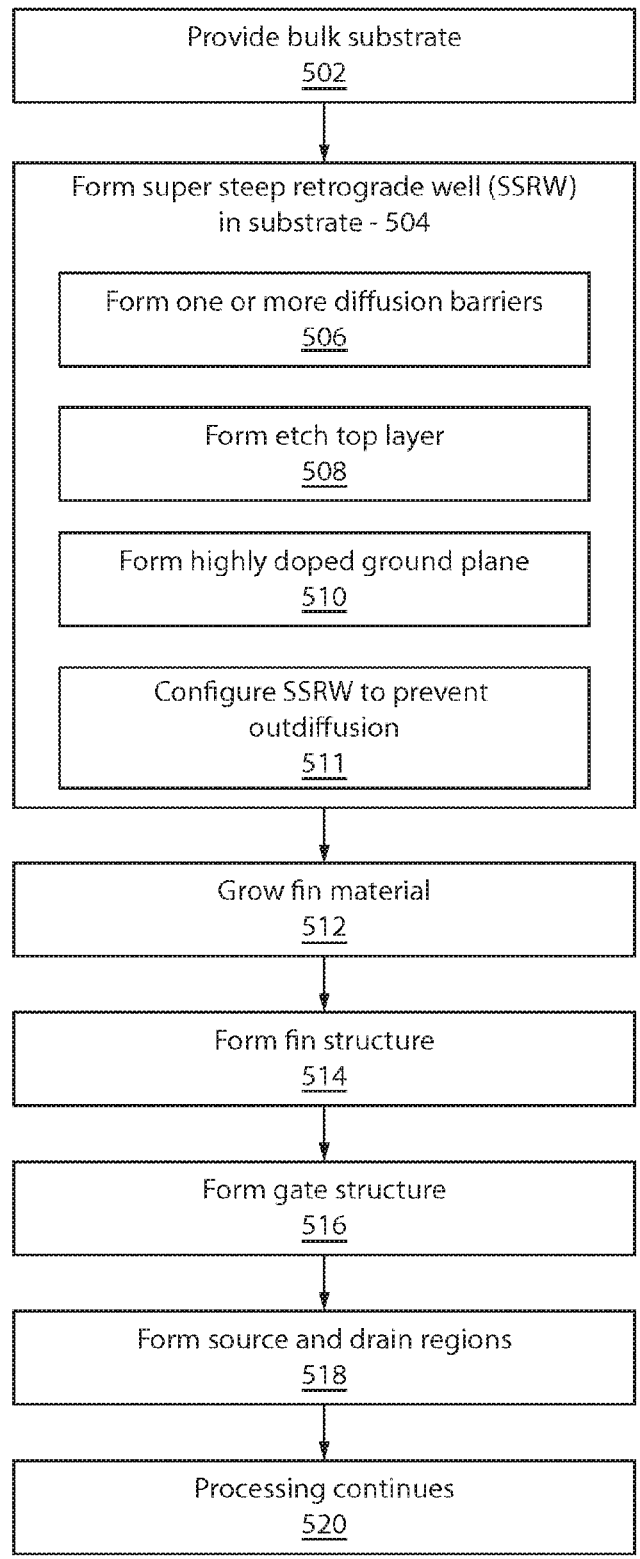
FIG. 12 is a block diagram showing steps for forming a semiconductor device with a SSRW in accordance with the present principles.

Referring to FIG. 12, a method for forming a fin transistor with a bulk substrate is shown in accordance with illustrative embodiments. It should be noted that the steps depicted in the blocks of FIG. 12 may be performed is different orders or may be executed concurrently as needed. In block 502, a bulk substrate is provided. The substrate may be extended by forming an epitaxially grown layer thereon. In block 504, a super steep retrograde well (SSRW) is formed in or on a bulk substrate. This may include growing the substrate extension (e.g., epitaxial growth) or implanting dopants into the substrate. The well includes a doped portion of a first conductivity type dopant and is formed in the bulk substrate below an undoped layer. The undoped layer or portion is space apart in depth and a location corresponding to a fin structure to be formed.

In block 506, the SSRW may include at least one diffusion barrier. The at least one diffusion barrier may be formed in the undoped layer. A diffusion barrier may be formed above or below the doped layer of the SSRW. In block 508, the undoped layer may include an etch stop layer or the etch stop layer may be separately formed. The etch stop layer may formed over the SSRW to increase the undoped layer and provide an etch stop for the formation of the fins.

In block 510, the doped portion preferably includes a highly doped ground plane. The doped portion may be grown on a diffusion barrier formed in or on the bulk substrate. In block 511, the doped portion includes a crystalline structure configured to prevent outdiffusion of the first conductivity type dopant. In particularly useful embodiments, the crystalline structure includes SiC and the first conductivity type dopant includes one of B and P and/or the crystalline structure includes SiGe and the first conductivity type dopant includes B.

In block 512, a fin material is grown over the undoped layer. Intervening layers may be provided. In block 514, the fin structure is formed from the fin material. In block 516, a gate structure is formed over the fin structure. In block 518, source and drain regions are formed adjacent to the fin structure to form a fin field effect transistor. Intervening dielectric materials may be formed between the source/drain and the fin structure. In block 520, processing continues to complete the devices. This may include the different processing of NFET/PFET devices, metallizations, etc.

Having described preferred embodiments for bulk finFET with super steep retrograde well (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device having fin transistors formed with a bulk substrate, comprising:
   a super steep retrograde well (SSRW) formed on or in a bulk substrate, the well including a doped portion of a first conductivity type dopant below an undoped layer, the doped portion including a highly doped ground plane, wherein the doped portion includes a crystalline structure configured to prevent outdiffusion of the first conductivity type dopant where the crystalline structure includes SiC and the first conductivity type dopant includes one of B and P;
   a fin structure formed over the SSRW from fin material;
   a gate stack formed over the fin structure; and
   source and drain regions formed adjacent to the fin structure to form a fin field effect transistor.

2. The device as recited in claim 1, wherein the SSRW includes at least one diffusion barrier formed below the undoped layer.

3. The device as recited in claim 1, further comprising an etch stop layer formed over the SSRW.

4. A device having fin transistors formed with a bulk substrate, comprising:
   a bulk substrate;
   an extension region formed on the bulk substrate;
   a shallow trench isolation region formed in the bulk substrate to separate device regions;
   a first device region including first super steep retrograde wells (SSRWs) in the extension region, the first SSRWs including a doped portion below an undoped portion of the extension region;
   a second device region including second SSRWs, the second SSRWs including a doped portion below an undoped layer of the extension region where doping in the second SSRWs is of opposite polarity of the first SSRWs;
   fin structures formed in a fin material, the fin material being doped in respective device regions with a conductivity type dopant opposite that of the SSRWs under a respective fin structure;
   gates stacks formed over the fin structures; and
   source and drain regions formed adjacent to the fin structures to form N-type and P-type fin field effect transistors.

5. The device as recited in claim 4, wherein the extension region includes a different material in the first device region from the second device region.

6. A device having fin transistors formed with a bulk substrate, comprising:
   a super steep retrograde well (SSRW) formed on or in a bulk substrate, the well including a doped portion of a first conductivity type dopant below an undoped layer, the doped portion including a highly doped ground plane, wherein the doped portion includes a crystalline structure configured to prevent outdiffusion of the first conductivity type dopant, where the crystalline structure includes SiGe and the first conductivity type dopant includes B;

a fin structure formed over the SSRW from fin material;

a gate stack formed over the fin structure; and source and drain regions formed adjacent to the fin structure to form a fin field effect transistor.

7. The device as recited in claim 6, wherein the SSRW includes at least one diffusion barrier formed below the undoped layer.

8. The device as recited in claim 6, further comprising an etch stop layer formed over the SSRW.

* * * * *